(12) United States Patent
Jeong et al.

(10) Patent No.: US 11,334,018 B2
(45) Date of Patent: May 17, 2022

(54) POWER SUPPLY DEVICE TO OUTPUT ZERO-CROSS INFORMATION OF HALF AC WAVE

(71) Applicant: HEWLETT-PACKARD DEVELOPMENT COMPANY, L.P., Spring, TX (US)

(72) Inventors: Ansik Jeong, Pangyo (KR); Jaewan Kim, Suwon (KR)

(73) Assignee: HEWLETT-PACKARD DEVELOPMENT COMPANY, L.P., Spring, TX (US)

( * ) Notice: Subject to any disclaimer, the term of this patent is extended or adjusted under 35 U.S.C. 154(b) by 0 days.

(21) Appl. No.: 17/269,413

(22) PCT Filed: Aug. 28, 2019

(86) PCT No.: PCT/US2019/048556
§ 371 (c)(1),
(2) Date: Feb. 18, 2021

(87) PCT Pub. No.: WO2020/055590
PCT Pub. Date: Mar. 19, 2020

(65) Prior Publication Data
US 2021/0255574 A1 Aug. 19, 2021

(30) Foreign Application Priority Data
Sep. 10, 2018 (KR) .................. 10-2018-0107700

(51) Int. Cl.
*G03G 15/00* (2006.01)
*G01R 19/175* (2006.01)

(52) U.S. Cl.
CPC ........... *G03G 15/80* (2013.01); *G01R 19/175* (2013.01); *G03G 15/5004* (2013.01)

(58) Field of Classification Search
CPC .............. G03G 15/80; G03G 15/5004; H04N 1/00885; H04N 1/00891; H04N 1/23; H04N 1/2346; H04N 2201/0094; B41J 29/38
See application file for complete search history.

(56) References Cited

U.S. PATENT DOCUMENTS 7,508,240 B1   3/2009  Yurick et al.
8,830,703 B2   9/2014  Murofushi
(Continued)

FOREIGN PATENT DOCUMENTS

CN     103095160 A    5/2013
JP     2005-346475   12/2005
JP     2010-239774   10/2010

*Primary Examiner* — Sophia S Chen
(74) *Attorney, Agent, or Firm* — Staas & Halsey LLP

(57) ABSTRACT

An image forming apparatus includes a print engine, a power supply apparatus, and a processor. The print engine is to print an image. The power supply apparatus is to supply power to the image forming apparatus and have a zero cross detection circuit to output zero cross information of input alternating circuit (AC) power. The processor is to determine whether the AC power is input using an output signal of the zero cross detection circuit. In response to an operation mode of the image forming apparatus being a normal mode, the zero cross detection circuit outputs zero cross information on a full wave of the input AC power. In response to an operation mode of the image forming apparatus being a power-saving mode, the zero cross detection circuit outputs zero cross information on a half wave of the input AC power.

15 Claims, 10 Drawing Sheets

(56) References Cited

U.S. PATENT DOCUMENTS

| | | |
|---|---|---|
| 9,405,261 B2 | 8/2016 | Jung et al. |
| 2010/0045346 A1 | 2/2010 | Yoshida |
| 2011/0064445 A1 | 3/2011 | Yashiro |
| 2011/0303648 A1* | 12/2011 | Kasai ................. G03G 15/2007 219/216 |
| 2014/0028354 A1 | 1/2014 | Yao et al. |
| 2015/0110513 A1* | 4/2015 | Nagasaki ............... G03G 15/80 399/70 |
| 2017/0090395 A1 | 3/2017 | Shimura |
| 2017/0168433 A1* | 6/2017 | Okamoto ........... G03G 15/2039 |

* cited by examiner

POWER SUPPLY DEVICE TO OUTPUT ZERO-CROSS INFORMATION OF HALF AC WAVE

CROSS REFERENCE TO RELATED APPLICATIONS

This application is a U.S. National Stage Application which claims the benefit under 35 U.S.C. § 371 of International Patent Application No. PCT/US2019/048556 filed on Aug. 28, 2019, which claims priority from Korean Patent Application No. 10-2018-0107700 filed on Sep. 10, 2018, the contents of each of which are incorporated herein by reference.

BACKGROUND

An image forming apparatus is an apparatus that performs image data generation; printing, reception, transmission, and the like. Examples thereof include a printer, a scanner, a copier, a facsimile, and a multifunction printer which integrates functions thereof.

The image forming apparatus needs information on whether a power source (as an example, alternating current (AC) power source) is supplied or not. In addition, zero cross information for controlling the supply of AC power to the fixing device is also used.

DETAILED DESCRIPTION

Hereinafter, various examples of the present disclosure will be described in detail with reference to the accompanying drawings. The examples to be described below may also be modified in various forms.

In the present specification, a case in which any component is "connected" with another component includes a case in which any component is 'directly connected' to another component and a case in which any component is 'connected to another component while having the other component interposed there between. In addition, a case in which any component "comprises" another component means that any component may further comprise other components; not exclude other components, unless explicitly described to the contrary.

The expression "image forming job" as used herein may refer to various jobs related with image, such as, formation of image or generation/storage/transmission of image files (e.g., printing, copying, scanning or faxing), and the expression "job" as used herein may refer to the image forming job, but may also refer to a series of processes for performance of the image forming job.

In addition, an "image forming device" refers to a device of printing print data generated from a terminal such as a computer on a recoding paper. Examples of the image forming device described above may include a copier; a printer, a facsimile, a scanner, a multi-function printer (MFP) of complexly implementing functions thereof through a single device, and the like. The image forming device may mean all devices capable of performing an image forming task, such as the printer, the copier, the scanner, the fax machine, the multi-function printer (MFP), or a display.

The expression "printing data" as used herein may refer to data converted into format that can be printed at the printer. If the printer supports direct printing, the file itself may be the printing data.

The expression "user" as used herein may refer to a person who performs manipulation related with the image forming job using the image forming apparatus or a device connected to the image forming apparatus wiry or wirelessly. Further, the expression "manager" as used herein may refer to a person who has an authority to access all the functions and systems of the image forming apparatus. The "manager" and the "user" may refer to the same person.

Figure 1:
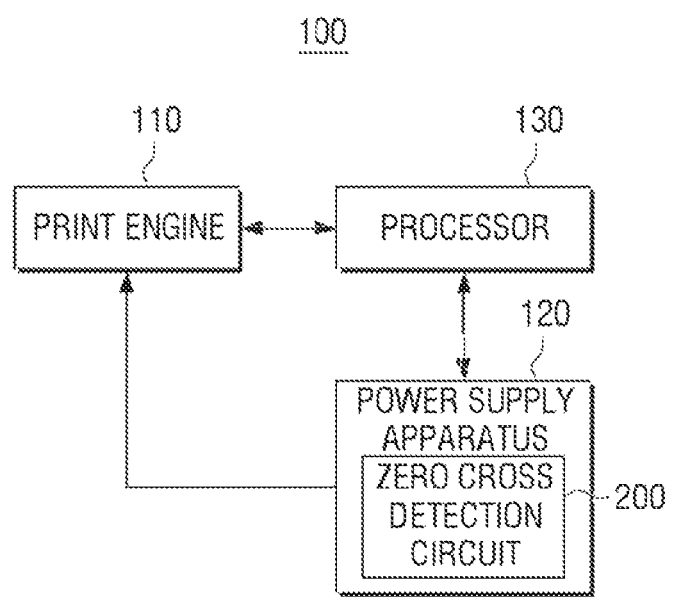
FIG. 1 is a block diagram which illustrates an example of brief configuration of an image forming apparatus of the present disclosure.

FIG. 1 is a block diagram which illustrates an example of brief configuration of an image forming apparatus of the present disclosure.

Referring to FIG. 1, an image forming apparatus may include a print engine 110, a power supply apparatus 120, and a processor 130.

The print engine 110 performs an image forming job. As an example, the print engine 110 can perform an image forming job using the power provided by the power supply apparatus 120. This print engine 110 can perform printing in an electro photographic manner.

The power supply apparatus 120 supplies power to each configuration in the mage forming apparatus 100. As an example, the power supply apparatus 120 can convert the alternating current (AC) power supplied from the outside into the direct current (DC) power, and provide the converted DC power to each configuration in the image forming apparatus 100. However, in the present example, it is described that one DC power is output, but when the image forming apparatus 100 uses a plurality of DC power in different sizes, the power supply apparatus 120 may output a plurality of DC power in different sizes.

Here, the power supply apparatus 120 may provide power to the configuration corresponding to the operation mode of the image forming apparatus 100. For example, when the image forming apparatus 100 is in the normal mode (or the print mode; the normal mode); the power supply apparatus 120 can supply power to all the configurations in the image forming apparatus 100. Conversely, when the image forming apparatus 100 is in the power-saving mode (or standby mode), the power supply apparatus 120 can supply power to a part of the configuration in the image forming apparatus 100.

Figure 2:
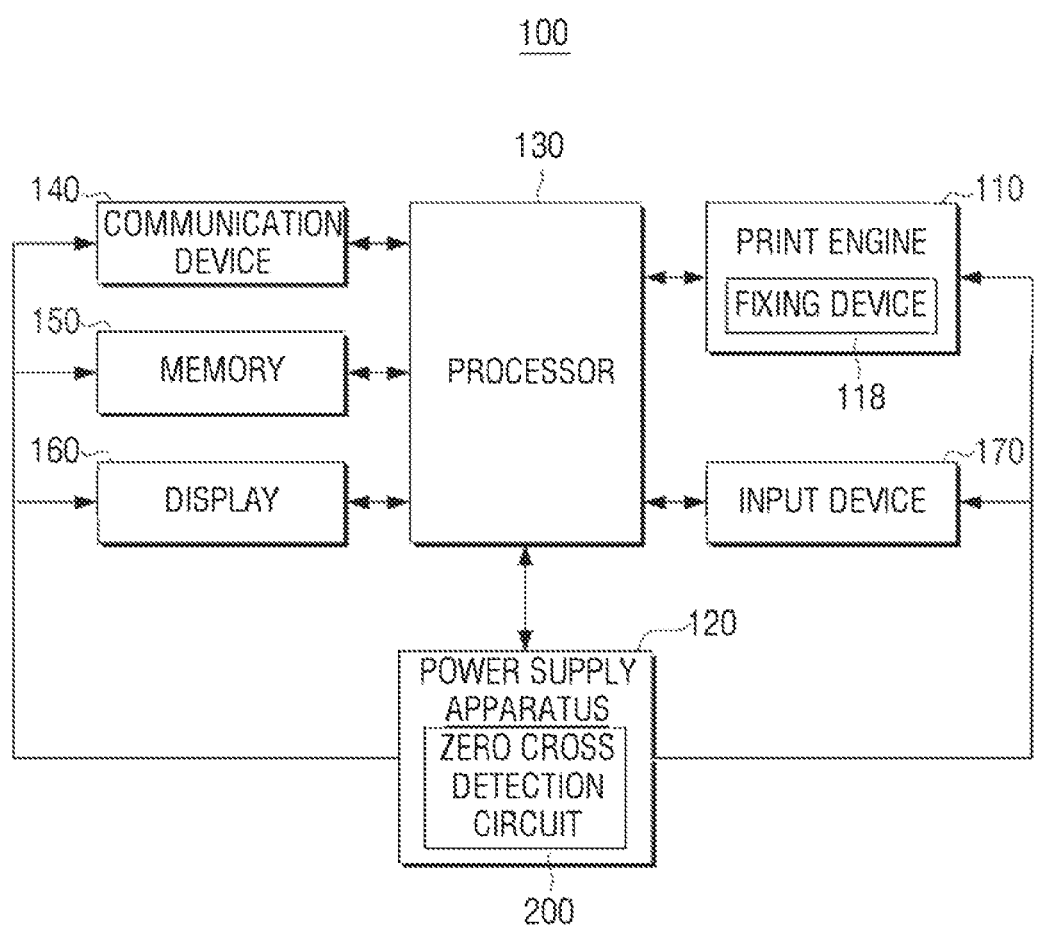
FIG. 2 is a block diagram which illustrates an example of a configuration of an image forming apparatus of the present disclosure.

The power supply apparatus 120 may provide the externally supplied AC power to the print engine 110 (as an example, a fixing device 118 shown in FIG. 2). As an example, the power supply apparatus 120 may selectively provide AC power to the fixing device 118 under the control of the processor 130. To this end, the power supply apparatus 120 may include a switching, element for selectively outputting AC power.

The power supply apparatus 120 may output a detection signal indicating whether the AC power is input. As an example; the power supply apparatus 120 includes a zero cross sensing circuit 200 for outputting a sensing signal, and may provide the sensing signal output from the zero cross sensing circuit 200 to the processor 130. Here, the detection signal may be a signal having a voltage value equal to or greater than a predetermined size at the zero cross point of the AC power source, and may be referred to as zero cross information.

The zero cross sensing circuit 200 can output the zero cross information of the input AC power. As an example, when the operation mode of the image forming apparatus 100 is the normal mode, the zero cross sensing circuit 200 may output zero cross information on the full wave of the inputted AC power, and when the mode is the power saving mode, it is possible to output the zero cross information on the half wave of the inputted AC power. The specific configuration and operation of the power supply apparatus 120 and the zero cross sensing circuit 200 will be described later with reference to FIGS. 3 to 9.

The processor 130 performs control for each configuration in the image forming apparatus 100. As an example, when the processor 130 receives print data from an external device (not shown), the processor can control the print engine 110 so that the received print data is printed.

Then, the processor 130 can determine an operation mode of the image forming apparatus. As an example, the processor 130 can determine whether the operation mode of the image forming apparatus 100 is the power saving mode or the normal mode by determining the presence or absence of the print job, the elapsed time after the print job, and the like. Here, the power saving mode refers to an operation mode in which most of the modules are powered off or minimized in order to minimize the power consumed when the system does not perform any operation.

The processor 130 may control each configuration in the image forming apparatus 100 to have an operation state corresponding to the determined operation mode. For example, when the power saving mode is determined, the processor 130 may control the power supply apparatus 120 so that power is supplied to some configurations (for example, a communication device 140 and a processor 130 to be described later) in the image forming apparatus 100. In addition, the processor 130 may control the power supply apparatus 120 so that AC power is not supplied to the print engine 110 and, in a normal mode, may control the power supply apparatus 120 to provide AC power to the print engine 110.

Here, the processor 130 may control the zero cross detection circuit 200 to output the zero cross information corresponding to the determined operation mode. As an example, the processor 130 can control the zero cross detection circuit 200 to output zero cross information on the radio wave of the AC power supply when the operation mode of the image forming apparatus 100 is the normal mode, and when the operation mode of the image forming apparatus 100 is a power saving mode, can control the zero cross detection circuit 200 to output the zero cross information on the half wave of the AC power.

The processor 130 may use the zero-cross information to determine whether the AC power is input. As an example, the processor 130 determines that the AC power is not input when the detection signal has not undergone a phase change for a predetermined period (approximately 20 ms), and the AC power is input when there is a phase change during a predetermined period. Meanwhile, in the above-described example, 20 ms is used in a predetermined cycle. However, in the implementation, the predetermined period may vary according to the frequency of the AC power source, and whether the AC power is input can be identified using whether there is a phase change in a plurality of periods rather than a single period.

In the present example, the processor 130 determines whether or not the AC power is input by using the detection signal. However, in the implementation, a separate configuration other than the processor 130 may be applied to the AC power to determine whether the AC power is input or not, and transmit the result to the processor 130.

As described above, the image forming apparatus 100 according to the present example detects whether or not the AC power source is input. Even if the AC power cord is disconnected and then plugged in again to stop the printing operation, an operation that meets the user's intention can be performed. Further, the image forming apparatus 100 according to the present example uses a circuit that detects whether power is supplied with ow power consumption, so that it is possible to easy achieve the power consumption of 1 W in the standby mode.

While a simple configuration of the image forming apparatus has been shown and described above, various configurations may be additionally provided at the time of implementation. This will be described below with reference to FIG. 2.

FIG. 2 is a block diagram which illustrates an example of a specific configuration of an image forming apparatus of the present disclosure, Referring to FIG. 2, the image forming apparatus 100 may include the print engine 110, the power supply apparatus 120, the processor 130, a communication device 140, a memory 150, a display 160, and an input device 170.

The power supply apparatus 120 has been described with reference to FIG. 1, repetitive description will not be provided. The print engine 110 and the processor 130 have been described with reference to FIG. 1, and overlapped description which was illustrated in FIG. 1 will not be described and a description related to the additional configuration of FIG. 2 will be described hereinafter.

The print engine 110 forms an image on a print paper in an electronic photograph method and fix the formed image using a fixing device 118.

The fixing device 118 fixes a visible image on a recording medium by applying heat and/or pressure to a visible image on the recording medium. Such a fixing device 118 may be heated by one heater or by a plurality of heaters. Where the heater can be heated by the alternating current power provided by the power supply apparatus 120.

The communication device 140 is formed to connect the image forming apparatus 100 to an external device, and is connected through local area network (LAN) and Internet network but also connected through universal serial bus (USB) and wireless module. Here, the wireless module may be WiFi, WiFi Direct, Near Field Communication (NFC), Bluetooth, or the like.

The communication device 140 can receive a job execution command from an external device (not shown), The communication device 140 may transmit and receive data related to the above-described task execution command. For example, if the user's job command is a print for a particular file, the communication device 140 may receive the print file. Here, the print file may be data in a printer language such as PostScript (PS), Printer Control Language (PCL), or the like, and may be a file itself such as PDF, XPS, BMP, and JPG.

The memory 150 may store print data. As an example, the memory 150 may store the print data received from the communication device 140 described above. The memory 150 may be implemented as a storage medium in the image forming apparatus 100, but may also be implemented as an external storage medium, a Removable Disk including a USB memory, a Web server via a network, or the like.

The memory 150 may back up and store the system data. As an example, when it is detected that AC power is not inputted, the memory 150 can back up and store the system data of the image forming apparatus 100, Here, the system data may be data to be backed up when the image forming apparatus is powered off, such as job log information, status information, and the like.

The display 160 displays various kinds of information provided by the image forming apparatus 100. As an example, the display 160 may display a user interface window for selecting various functions provided by the image forming apparatus 100.

The input device 170 may include a plurality of function keys for setting or selecting various functions available in the image forming apparatus 100 by a user.

The processor 130 can switch the operation mode of the image forming apparatus 100 to the normal mode when the print data is received from the communication device 140 in the power save state. At this time, the processor 130 can control the phase of the AC power supplied to the fixing device 118 so that the fixing device 118 has a predetermined fusing temperature. Here, the phase control means that the current control is performed during a specific phase period of the phase of the AC power. In the present example, the processor 130 performs phase control on the AC power supplied to the fixing device 118. However, in the implementation, the processor 130 may perform the phase control on the AC power supplied to the fixing device 118 to perform waveform number control.

If it is determined that AC power is not input, the processor 130 can cancel the print job for the received print data, back up the system data to the memory 150, and reset the system.

As described above, the image forming apparatus 100 according to the present example detects whether or not the AC power source is input. Even if the AC power cord is disconnected and then plugged in again to stop the printing operation, an operation that meets the users intention can be performed. In addition, the image forming apparatus 100 according to the present example checks whether power is supplied by using a half wave of the AC power source in the power saving mode, so that the power consumption in the power saving mode can be further reduced.

Referring to FIGS. 1 and 2, although the power supply apparatus 120 is shown and described as being included in the image forming apparatus 100, the power supply apparatus 120 may be implemented as a separate apparatus, and in such a case, the power supply 200 may be applied to any electronic de-ice that needs to be powered on or off.

Figure 3:
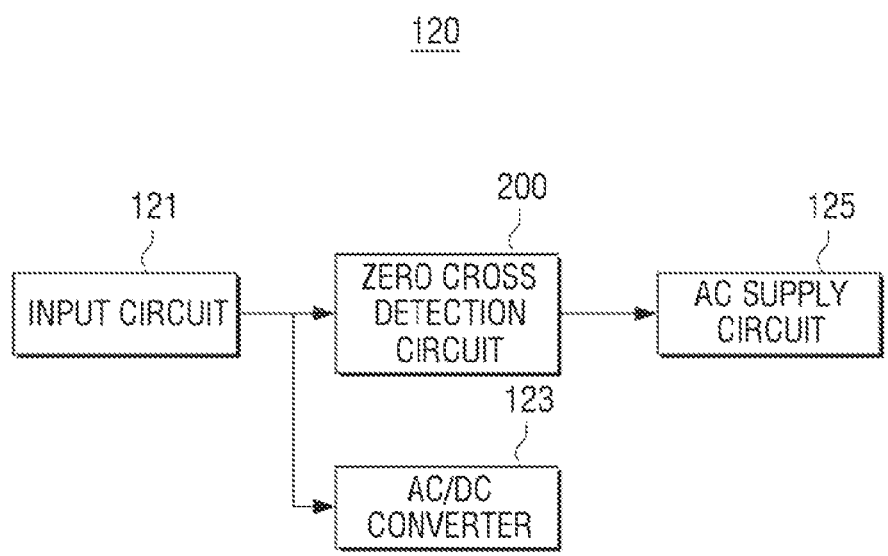
FIG. 3 is a view which illustrates an example of the power supply apparatus of FIG. 1.

FIG. 3 is a view which illustrates an example of the power supply apparatus of FIG. 1.

Referring to FIG. 3, the power supply, apparatus 120 may include an input circuit 121, an AC/DC converter 123, an AC supply circuit 125, a zero cross detection circuit 200.

The input circuit 121 receives the AC power. As an example, the input circuit 121 can receive general commercial AC power (for example, 230 V, 50 Hz), The input circuit 121 may be implemented by a power cable or the like that connects the image forming apparatus 100 to an external outlet.

The AC/DC converter 123 converts the input AC power into a DC power having a predetermined size and outputs the DC power. As an example, the AC/DC converter 123 may be implemented as a switching mode power supply (hereinafter, referred to as SMPS), and may be a DC power source having a predetermined size (For example, 24V or 5V) and output same. In the illustrated example, one DC power source is shown as being output, but in implementation, the AC/DC converter 123 can output a plurality of DC power sources of different sizes. Also, in implementation, the AC/DC converter 123 may be implemented with a rectifier circuit and a transformer.

The zero-cross detection circuit 200 is connected in parallel to the input circuit 121, and can detect whether or not the AC power is input. As an example, the zero-cross detection circuit 200 can detect a potential change of an input AC power source. For example, the zero crossing circuit 200 may sense a first zero crossing point of the alternating power source that changes from a positive voltage to a negative voltage and a second zero crossing point of the alternating current source that changes from a negative voltage to a positive voltage.

In the meantime, in the normal mode, both the first zero-cross point and the second zero-cross point are to control the AC power supplied to the fixing device 118. However, in the power saving mode, the information of both the first zero cross point and the second zero cross point is not necessary because the above-mentioned zero cross information is used to confirm whether AC is inputted.

Accordingly, the zero cross detection circuit 200 according to the present disclosure outputs zero cross information including information on the first and second zero cross points in the normal mode, and outputs the zero cross information including the information on the first zero cross point in a power saving mode. In the meantime, at the time of implementation, it is possible to output the information about the second zero cross point instead of the information about the first zero cross point in the power saving mode The zero cross detection circuit 200 can selectively output AC power to the AC supply circuit 125 according to the operation mode of the image forming apparatus 100. As an example; when the operation mode of the image forming apparatus 100 is the normal mode, the zero cross detection circuit 200 outputs the inputted AC power to the AC supply circuit 125, and when the operation mode of the image forming apparatus 100 is in the power saving mode, it may not output the inputted AC power to the AC supply circuit 125. The specific configuration and operation of the zero cross detection circuit 200 according to the present disclosure will be described later with reference to FIGS. 4 to 9.

The AC output circuit 125 may selectively provide the AC power provided from the zero cross detection circuit 200 to the fixing device 118.

In describing FIG. 3, the zero cross detection circuit 200 selectively outputs the AC power to the AC supply circuit 125 according to the operation mode of the image forming apparatus. However, in the implementation, the zero cross detection circuit 200 may output zero-cross information, and the AC output 125 may perform the selective output operation of the AC power supply.

Figure 4:
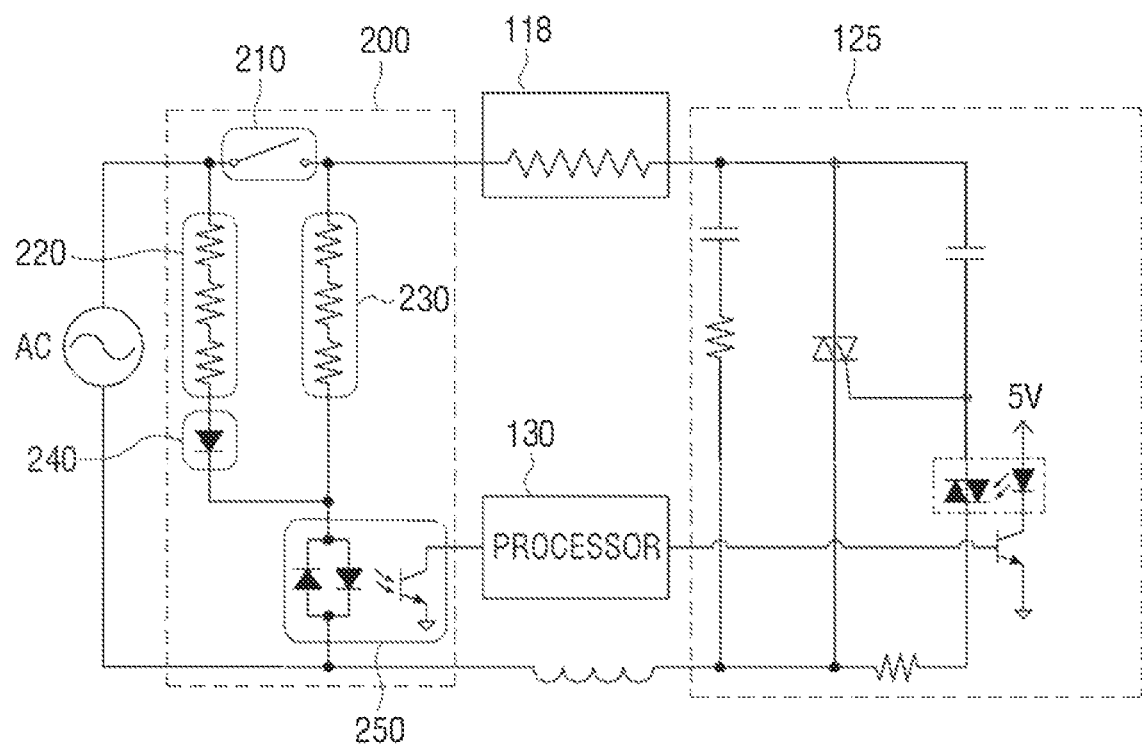
FIG. 4 is a circuit diagram which illustrates an example of the zero cross detection circuit and the AC supply circuit of FIG. 3, FIGS. 5 and 6 are views to describe an operation of the zero cross detection circuit in a normal mode.

FIG. 4 is a circuit diagram which illustrates an example of the zero cross detection circuit and the AC supply circuit of FIG. 3.

Referring to FIG. 4, the zero cross detection circuit 200 may include a switching element 210, a first resistance circuit 220, a second resistance circuit 230, a rectifier circuit 240, and a photo coupler 250.

The switching element 210 may selectively provide AC power to the AC supply circuit and the second resistance circuit under the control of the processor 130. As an example, when the operation state of the image forming apparatus 100 is the normal mode, the switching element 210 provides the input AC power to the second resistance circuit 230 and the AC supply circuit 125, and the image forming apparatus 100 does not provide the input AC power to the second resistance circuit 230 and the AC supply circuit 125 when the operating state of the power supply apparatus 120 is the power saving mode.

For this operation, the switching element 210 may be connected to one end of the input circuit 121 to receive the AC power, and the other end may be connected to one end (or an AC supply circuit) of the fixing device 118. As an example the switching element 210 may be implemented as a relay, a triac, a thyristor, or the like.

The switching element 210 performs a switching operation in accordance with the operation state of the image forming apparatus 100 but also performs a switching operation of the switching element 210 when a malfunction (for example, shorting of the fixing unit) occurs and may perform a protective device function that is opened when it is necessary to prevent an electric accident and prevents the AC power source from being supplied into the image forming apparatus 100.

The first resistance circuit 220 can drop the voltage of the input AC power. As an example, the first resistance circuit 220 may have one end connected to one end of the input circuit 121 and the other end connected to one end of the rectifier circuit 240. The first resistance circuit 220 may be realized by connecting a plurality of resistors in series. The resistance value of the first resistance circuit 220 may be 2 to 10 times larger than the resistance value of the second resistance circuit 230.

The second resistance circuit 230 receives the AC power when the operation state of the image forming apparatus 100 is in the normal mode, and can drop the supplied AC power. As an example, the second resistance circuit 230 may have one end connected to the other end of the switching element 210 and the other end connected to the other end of the rectifier circuit 240 and one end of the photo coupler 250. The second resistance circuit 230 may be implemented by connecting a plurality of resistors in series and the resistance value of the second resistance circuit 230 may be smaller than the resistance value of the first resistance circuit 220.

The rectifier circuit 240 can selectively conduct current in a certain phase of the AC power source. For example, the rectifier circuit 240 can conduct current when the AC power source has a positive value and can shut off the current when the AC power source has a negative value. One end of the rectifier circuit 240 is connected to the other end of the first resistance circuit 220 and the other end of the rectifier circuit 240 is commonly connected to one end of the second resistance circuit 230 and the photo coupler 250.

The rectifier circuit 240 may be implemented as one of a diode, a bipolar junction transistor, and a field effect transistor. For example, when the rectifier circuit 240 is implemented as a diode, the anode of the diode is connected to the other end of the first resistance circuit 220, the cathode of the diode is connected to the other end of the second resistance circuit 230 and one end of the photo coupler 250.

The photo coupler 250 may generate information about the zero cross point of the AC power and provide the generated zero cross information to the processor 130. The other end of the rectifier circuit 240 and the other end of the second resistance circuit 230 are commonly connected and the other end of the photo coupler 250 is connected to the other end of the input circuit 121.

The AC supply circuit 125 includes a phototriac and selectively supplies AC power provided from the zero cross detection circuit 200 to the fixing device 118 under the control of the processor 130. As an example, the processor 130 may perform the phase control on the AC power supplied to the fixing device 118 when the operation mode of the image forming apparatus 100 is in the normal mode, based on the zero cross information provided from the photo coupler 250.

In illustrating FIG. 4, it has been described that the switching element 210 is included in the zero cross detection circuit 200, but the switching element 210 may be disposed on an AC supply circuit side.

The operation of the zero cross detection circuit 200 and the resulting output waveform of the photo coupler 250 when the operation mode of the image forming apparatus 100 is the normal mode will be described first with reference to FIGS. 5 to 7, the operation of the zero-cross detection circuit 200 and the resulting output waveform of the photo coupler 250 when the operation mode of the image forming apparatus 100 is the power saving mode will be described with reference to FIGS. 8 and 9.

Figure 5:
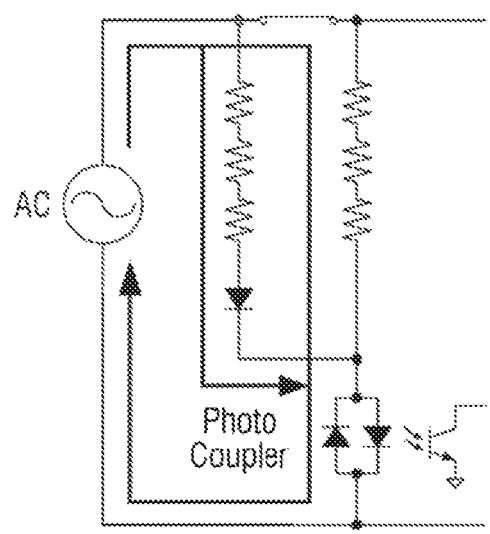
Figure 6:
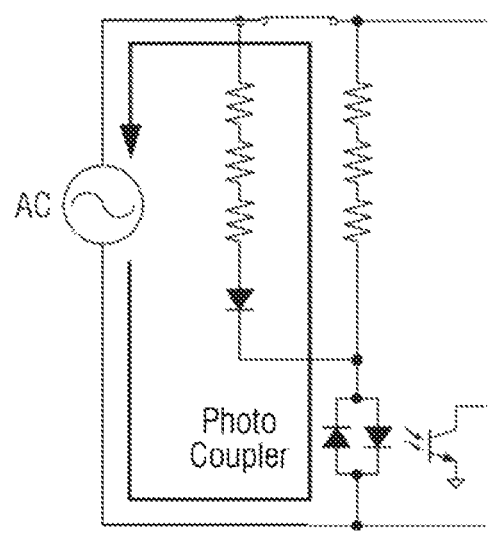

FIGS. 5 and 6 are views to describe an operation of the zero cross detection circuit in a normal mode.

Referring to FIGS. 5 and 6, the operation mode of the image forming apparatus 100 is a normal mode, the switching element 210 is connected.

Here, when AC power has a plus (+) value, a first current path via AC power, first resistance circuit 220, the rectifier circuit 240, and the photo coupler 250 and a second current path via the second resistance circuit 230 and the photo coupler 250 are formed. The light emitting element of the photo coupler 250 emits light by the first current path and the second current path. As the light emitting element of the photo coupler 250 emits light, the light receiving element of the photo coupler 250 receives light and accordingly, the output of the photo coupler is connected to the grounding end (grounding of DC power).

When the AC power gradually approaches the zero cross, the AC power becomes smaller than a predetermined potential (for example, 0.7 V) at which the photo coupler 250 is turned on, so that the light emitting element of the photo coupler 250 does not emit light so that the output terminal of the photo coupler has a predetermined potential.

Thereafter, when the AC power has minus (−) value and the size of the minus (−) value is greater than a predetermined value (for example, 0.7V), as illustrated in FIG. 6, a third current path via the AC power, the photo coupler 250, and the second resistance circuit 230 are formed. By the third current path, the light emitting element of the photo coupler 250 emits light and the output of the photo coupler 250 is connected to the grounding.

Figure 7:
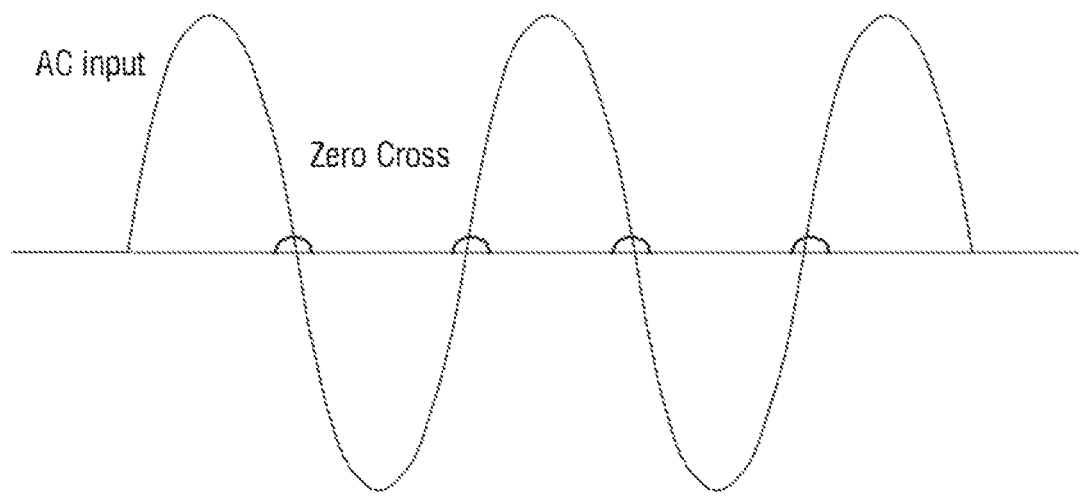
FIG. 7 is a waveform diagram which illustrates an example of a signal that is output from the zero cross detection circuit in a normal mode.

The output of the photo coupler according thereto can output zero cross information as illustrated in FIG. 7.

Figure 8:
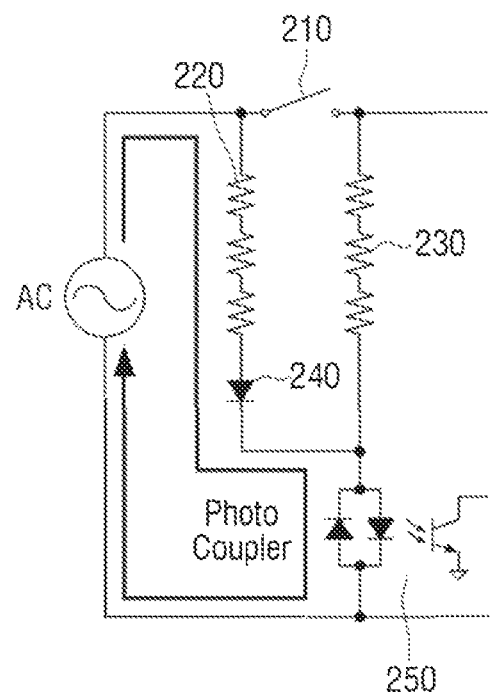
FIG. 8 is a view which illustrates an operation of the zero cross detection circuit in a power-saving mode.
Figure 9:
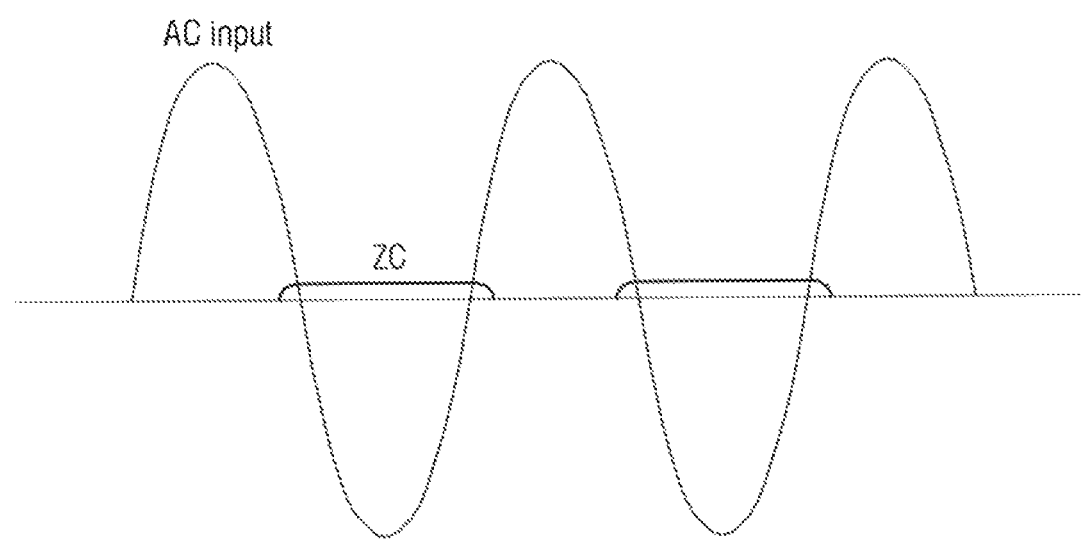
FIG. 9 is a waveform diagram which illustrates an example of a signal that is output from the zero cross detection circuit in a power-saving mode.

FIG. 8 is a view which illustrates an operation of the zero cross detection circuit in a power-saving mode, and FIG. 9 is a waveform diagram which illustrates an example of a signal that is output from the zero cross detection circuit in a power-saving mode.

Referring to FIGS. 8 and 9, the operation mode of the image forming apparatus 100 is a power saving mode and the switching element 210 is in an opened status.

At this time, when the AC power source has a plus (+) value, a current path via the AC power source, the first resistance circuit 220, the rectifier circuit 240, and the photo coupler 250 is formed, and the light emitting element of the photo coupler 250 will emit light. Since the light emitting element of the photo coupler 250 emits light, the light receiving element of the photo coupler 250 receives light, and the output of the photo coupler 250 is connected to the ground terminal.

If the current path is shut off as the AC power gradually approaches zero cross; the light emitting element of the photo coupler 250 does not emit light, so that the output of the photo coupler has a predetermined potential.

When the AC power has a minus (−) value, the current path is shut off by the rectifier circuit 240, and the output of the photo coupler 250 maintains a predetermined potential.

After that, if the AC power source has a plus (+) value and the current path is formed again, the light receiving element of the photo coupler 250 receives light, and the output of the photo coupler is connected to the ground terminal.

The output of the photo coupler may output the zero cross information as illustrated in FIG. 9.

As described above, in the zero cross detection circuit according to the present disclosure, power consumption by the first resistance circuit is generated for a half wave of the power in the power saving mode, and power consumption is reduced by 50%.

Figure 10:
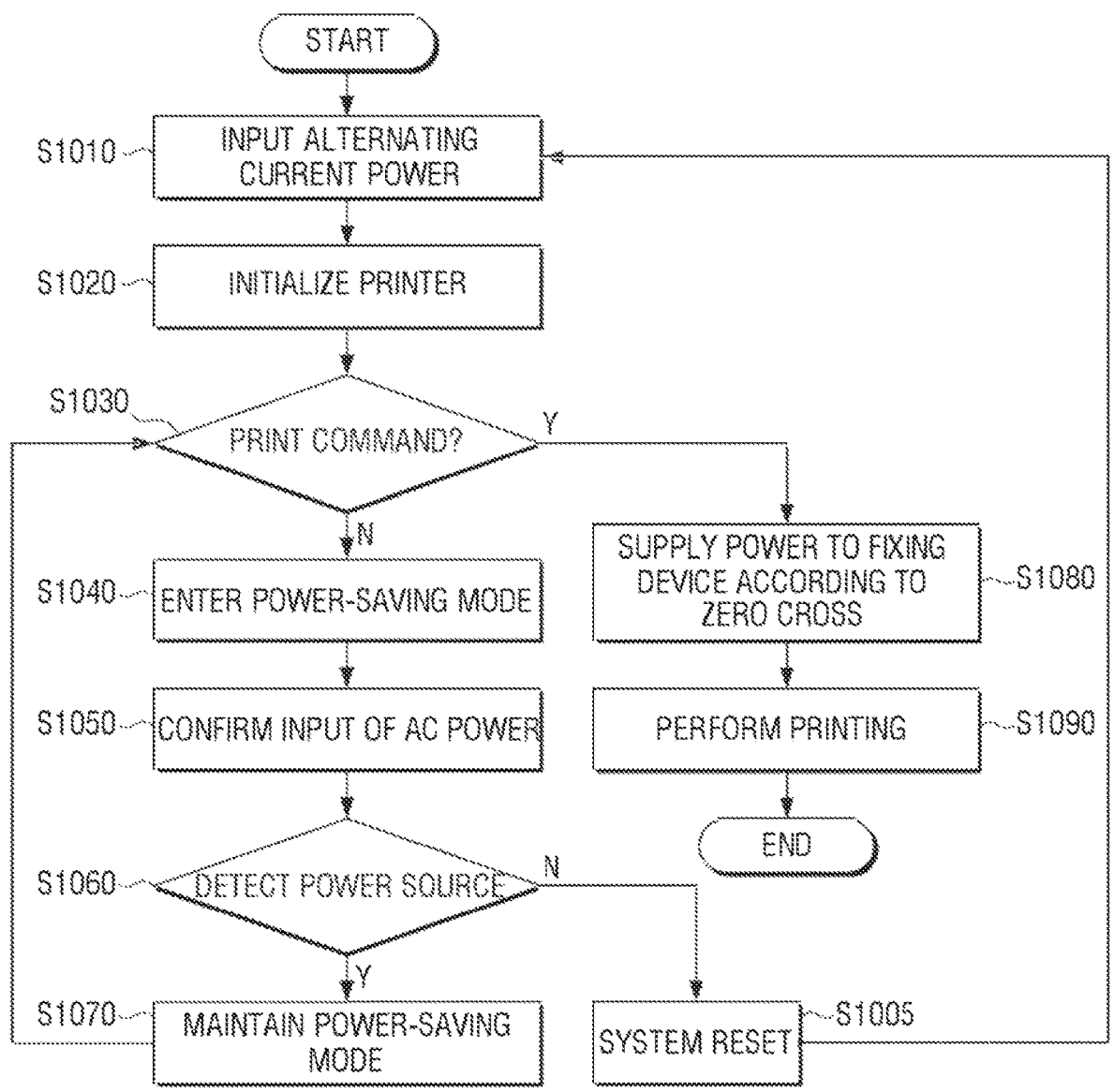
FIG. 10 is a flowchart to describe an example of an image forming method of the present disclosure.

FIG. 10 is a flowchart to describe an example of an image forming method of the present disclosure.

When the AC power is input (S1010), the image forming apparatus can be initialized (S1020).

Then, it is determined whether print data is input in operation S1030. As a result of the determination, if the print data is not inputted and the print job is performed and the preset time has passed, the operation mode of the image forming apparatus can be changed to the power saving mode in operation S1040.

When the operation mode of the image forming apparatus 100 is changed to the power saving mode, the processor 130 may turn off the switching element 210. Accordingly, the zero cross detection circuit 200 can detect whether or not the AC power is input by using a half wave of the AC power in operation S1050.

As a result of the detection, if it is determined that AC power is input in operation S1060-Y, the current operation mode (that the power saving mode) is maintained in operation S1070 and input of the print data can be waited for. Meanwhile, in the illustrated example, it is detected that the AC power source is input in the power saving mode. However, in the implementation, it is determined whether the AC power source is input, that is, whether or not the AC power source is cut off.

If it is determined that the AC power source is not inputted, that is, if it is determined that the AC power supply is interrupted in operation S1060-N, the system of the image forming apparatus is reset in operation S1005, As an example, the system data may be backed up in the memory 150 and the system can be reset.

When the print data is input in operation S1030-Y, the current operation mode is changed to the normal mode and warm-up for performing the print job can be performed in operation S1080. As an example, the fixing device may be provided with an AC power source so that the fixing device has a predetermined temperature.

Thereafter, when warm up is completed, a print work for the received print data is performed in operation S1090.

As described above, the image forming method according to the present example detects whether or not the AC power source is input. Even if the AC power cord is removed and then plugged in again for to stop the printing operation, so that an operation a user intends can be performed. Furthermore, when the operation mode of the image forming apparatus confirms whether or not the AC power source is inputted by the half wave of the AC power source in the power saving mode, the power consumption in the power saving mode can be further reduced. The image forming method as shown in FIG. 10 can be executed on an image forming apparatus having the configuration of FIG. 1 or FIG. 2, or on an image forming apparatus having other configurations.

The image forming method described above can be implemented by a program and provided to an image forming apparatus. In particular, a program including an image forming method may be provided stored in a non-transitory computer readable medium.

A non-transitory readable medium means a medium that stores data for a short period of time such as a register, a cache, a memory, etc., but semi-permanently stores data and can be read by a device. In particular, the various applications or programs described above may be stored and provided on non-volatile readable media such as CD. DVD, hard disk, Blu-ray disk, USB, memory card, ROM, or the like.

The foregoing examples are merely examples and are not to be construed as limiting. The examples may be readily applied to other types of device or apparatus. Also, the description of the examples is intended to be illustrative, and not limiting, and many modifications and variations will be apparent to those skilled in the art

What is claimed is:
1. An image forming apparatus comprising:
a print engine to print an image;
a power supply apparatus to supply power to the image forming apparatus, the power supply apparatus including a zero cross detection circuit to output zero cross information of input alternating circuit (AC) power; and
a processor to determine whether the AC power is input using an output signal of the zero cross detection circuit,
wherein, in response to an operation mode of the image forming apparatus being a normal mode, the zero cross detection circuit is to output zero cross information on a full wave of the input AC power, and
in response to an operation mode of the image forming apparatus being a power-saving mode, the zero cross detection circuit is to output zero cross information on a half wave of the input AC power.
2. The image forming apparatus of claim 1, wherein the zero cross detection circuit comprises:
a first resistance circuit including a first end connected to the AC power;

a rectifier circuit including a first end connected to a second end of the first resistance circuit;

a photo coupler including a first end connected to the rectifier circuit to output the zero cross information;

a switching element including a first end connected to the AC power; and a second resistance circuit including a first end connected to a second end of the switching element, a second end of the second resistance circuit is connected to a second end of the rectifier circuit and the first end of the photo coupler.

3. The image forming apparatus of claim 2, wherein the processor controls a status of the switching element according to the operation mode of the image forming apparatus.

4. The image forming apparatus of claim 2, wherein the rectifier circuit is composed of one of a diode, a bipolar junction transistor, and a field effect transistor.

5. The image forming apparatus of claim 2, wherein the first resistance circuit has a resistance value greater than a second resistance value.

6. The image forming apparatus of claim 4, wherein the first resistance circuit has a resistance value two to ten times greater than the second resistance circuit.

7. The image forming apparatus of claim 1, wherein the power supply apparatus comprises:

an AC supply circuit which selectively provides a fixing device with the input AC power, wherein the processor performs a phase control of the AC power supplied to the fixing device based on the output signal of the zero cross detection circuit.

8. The image forming apparatus of claim 1, wherein the processor, when it is determined that the output signal of the zero cross detection circuit is not input for a predetermined time, determines that the AC power is not input.

9. The image forming apparatus of claim 8, further comprising:

a memory, wherein when the processor determines that the AC power is not input, the processor backs up system data of the image forming apparatus to the memory.

10. The image forming apparatus of claim 8, wherein when the processor determines the AC power is not input, the processor resets the image forming apparatus.

11. A power supply apparatus comprising:

an input circuit to receive an alternating current (AC) power;

an AC/DC convertor to convert input AC power to a direct current (DC) power having a predetermined size and to output the DC power; and a zero cross detection circuit to output zero cross information of the AC power, wherein the zero cross detection circuit, when an operation mode of the power supply apparatus is a normal mode, outputs zero cross information of the input AC power, and when all operations of the power supply apparatus are in a power-saving mode, outputs zero cross information on a half wave of the input AC power.

12. The power supply apparatus of claim 11, wherein the zero cross detection circuit comprises:

a first resistance circuit including a first end connected to the AC power;

a rectifier circuit including a first end connected to a second end of the first resistance circuit;

a photo coupler including a first end connected to the rectifier circuit to output the zero cross information;

a switching element including a first end connected to the AC power; and a second resistance circuit including a first end connected to a second end of the switching element, a second end of the second resistance circuit is connected to a second end of the rectifier circuit and the first end of the photo coupler.

13. The power supply apparatus of claim 12, wherein the processor controls a status of the switching element according to the operation mode of the image forming apparatus.

14. The power supply apparatus of claim 12, further comprising:

an AC supply circuit including a first end connected to the second end of the switching element to selectively output the AC power.

15. The power supply apparatus of claim 12, wherein the rectifier circuit is composed of one of a diode, a bipolar junction transistor, and a field effect transistor.

* * * * *